(12) United States Patent
Heid

(10) Patent No.: US 6,486,670 B2
(45) Date of Patent: Nov. 26, 2002

(54) METHOD FOR IMAGING WITH NUCLEAR MAGNETIC RESONANCE GIVEN A K-SPACE TRAJECTORY PROCEEDING ON AN IRREGULAR GRID

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/824,337

(22) Filed: Apr. 2, 2001

(65) Prior Publication Data

US 2001/0026157 A1 Oct. 4, 2001

(30) Foreign Application Priority Data

Mar. 31, 2000 (DE) .......................................... 100 16 234

(51) Int. Cl.$^7$ .................................................. G01V 3/00
(52) U.S. Cl. ...................................... 324/307; 324/309
(58) Field of Search ................................... 324/307, 309

(56) References Cited

U.S. PATENT DOCUMENTS

| | | | |
|---|---|---|---|
| 4,748,410 A | | 5/1988 | Macovski |
| 5,084,675 A | * | 1/1992 | Reinfelder et al. .......... 324/307 |
| 5,087,880 A | | 2/1992 | Bruder et al. |
| 5,510,710 A | * | 4/1996 | Nauerth ....................... 324/307 |
| 5,557,203 A | * | 9/1996 | Nauerth ....................... 324/309 |
| 6,020,739 A | * | 2/2000 | Meyer et al. ................ 324/300 |
| 6,252,401 B1 | * | 6/2001 | Werthner et al. ............ 324/307 |
| 6,255,820 B1 | * | 7/2001 | Steckner ...................... 324/307 |

\* cited by examiner

Primary Examiner—Edward Lefkowitz
Assistant Examiner—Dixomara Vargas
(74) Attorney, Agent, or Firm—Schiff Hardin & Waite

(57) ABSTRACT

In a method for imaging with nuclear magnetic resonance, magnetic resonance signals are read out under the influence of a magnetic gradient field. A direction of a gradient of the gradient field is modified such during the reception. The k-space trajectory proceeds along a curved path. The magnetic resonance signals are sampled with a variable sampling rate and are digitized. The sampling rate is varied such that an occupation density of k-space with samples is essentially uniform. Interpolation samples that are arranged on a rectangular grid in k-space are generated from the samples by interpolation. The interpolation samples are subjected to a Fourier transformation for generating image data.

5 Claims, 2 Drawing Sheets

METHOD FOR IMAGING WITH NUCLEAR MAGNETIC RESONANCE GIVEN A K-SPACE TRAJECTORY PROCEEDING ON AN IRREGULAR GRID

BACKGROUND OF THE INVENTION

1. Field of the Invention

The present invention is directed to a method for imaging with nuclear magnetic resonance given a k-space trajectory proceeding on a curve.

2. Description of the Prior Art

For image generation with nuclear magnetic resonance, magnetic resonance signals are spatially encoded with magnetic gradient fields before and during their reception. The spatial encoding means that k-space is occupied with signals, k-space being defined via the time integral of the gradient fields. The signals in k-space are then subjected to a Fourier transformation whose result is supplied to an image presentation. In certain fast pulse sequences, particularly given the echo-planar method, the gradient fields are additionally rapidly switched during the reception of the magnetic resonance signals. For example, the amplitude of a first gradient field is sinusoidally modified given a constant amplitude of a further gradient field whose gradient is aligned perpendicular to the gradient of the first gradient field. A sinusoidal signal occupancy thus occurs in the k-space.

European Application 0 076 054 discloses a method for imaging with nuclear magnetic resonance using the echo-planar sequences wherein sinusoidal gradients are employed. In order to avoid image distortions, the sampling of the received magnetic resonance signals ensues equidistantly in k-space. This corresponds to a non-equidistant sampling of the received magnetic resonance signals in the time domain. Since the sampling must ensue on a serpentine-like trajectory along the lines of the Cartesian k-space grid, the fastest possible sampling of k-space cannot be achieved. Other properties such as, for example, the motion sensitivity thus are also essentially defined.

German OS 40 03 547 discloses how the image information can be distortion-corrected by a sampling with a constant sampling rate in the time domain. The constant sampling rate denotes a non-equidistant occupancy of k-space with signals given a sinusoidal trajectory in k-space. The non-equidistant signals are then imaged onto a rectangular grid by an interpolation. The following Fourier transformation then yields image data for a non-distorted presentation. The sampling of the received magnetic resonance signal must allow the sampling theorem to be satisfied for the highest frequency to be sampled. Given the constant sampling rate employed, however, this means that other regions of the magnetic resonance signal are highly over-sampled.

SUMMARY OF THE INVENTION

An object of the present invention is to provide a method for imaging with magnetic resonance wherein the reconstruction of the image data from the received magnetic resonance signals can be implemented with reduced outlay.

The object is achieved with the following method steps: Magnetic resonance signals are read out under the influence of a magnetic gradient field with the direction of a gradient of the gradient field being modified during the reception, so that the k-space trajectory proceeds on a curve. The magnetic resonance signals are sampled with a variable sampling rate and the samples are digitized. The sampling rate is varied such that an occupation density of k-space with samples is essentially uniform. The inventive method yields a two-fold advantage in view of the outlay for the reconstruction of the image data. First, the variable sampling rate makes it possible always to optimally implement a sampling that satisfies the sampling theorem, so that substantially fewer raw data are generated compared to a constant sampling. However, the samples do not yet lie on a rectangular grid, so that interpolation data must still be generated with an interpolation procedure. Due to the uniform occupancy of k-space with samples that has ensued as a result of the same sampling density, a sampling density correction is not required and a processing step is thereby eliminated. This is true for 2D as well as 3D trajectories wherein the gradient amplitudes are varied during the reception phase (readout), for example given rosette-shaped sampling (Lissajou figure trajectory) or given projection sampling. More general sampling trajectories such as, for example, Archimedean spirals yield shorter sampling times with a given gradient power (amplitude and rise time) and have a more beneficial motion susceptibility. These trajectories, however, do not traverse the grid points of the Cartesian k-space grid.

In an embodiment, the k-space trajectory proceeds helically. The middle of the k-space is thereby sampled first, his defining the contrast in the imaging. Important image information in the imaging of rapidly changing events thus can be acquired first.

In another embodiment, the interpolation is implemented as sinc interpolation. This interpolation can be implemented especially simply when k-space is occupied with identical sampling density. Values of the sinc function weighted with the corresponding samples that arise at the grid points are added and thus yield the interpolation values.

DESCRIPTION OF THE PREFERRED EMBODIMENTS

The inventive method for imaging with magnetic resonance or nuclear magnetic resonance can—except for the differences described below—be utilized on a conventional diagnostic magnetic resonance apparatus. The structure of such an apparatus is well known. The inventive method also can be applied to the basic method for imaging. However, it is then assumed that a spatial encoding of received magnetic resonance signals during the reception ensues with magnetic fields that are continuously variable in amplitude. The direction of the gradient of the gradient field is thus switched. The k-space trajectory proceeds on a curved trajectory in k-space. The curvature of the k-space trajectory can be formed either in only one plane (2D k-space trajectory) or in space (3D k-space trajectory). The echo-planar method or the spiral scanning method are exemplary imaging sequences with switched gradient directions during reception. The reception gradient is also referred to as a read gradient.

The gradient curve or the k-space trajectory as well is determined or selected from a number of stored sequences before the execution of the selected measuring sequence. Fundamentally, the trajectory is defined such that the entire k-space is traversed.

Figure 1:
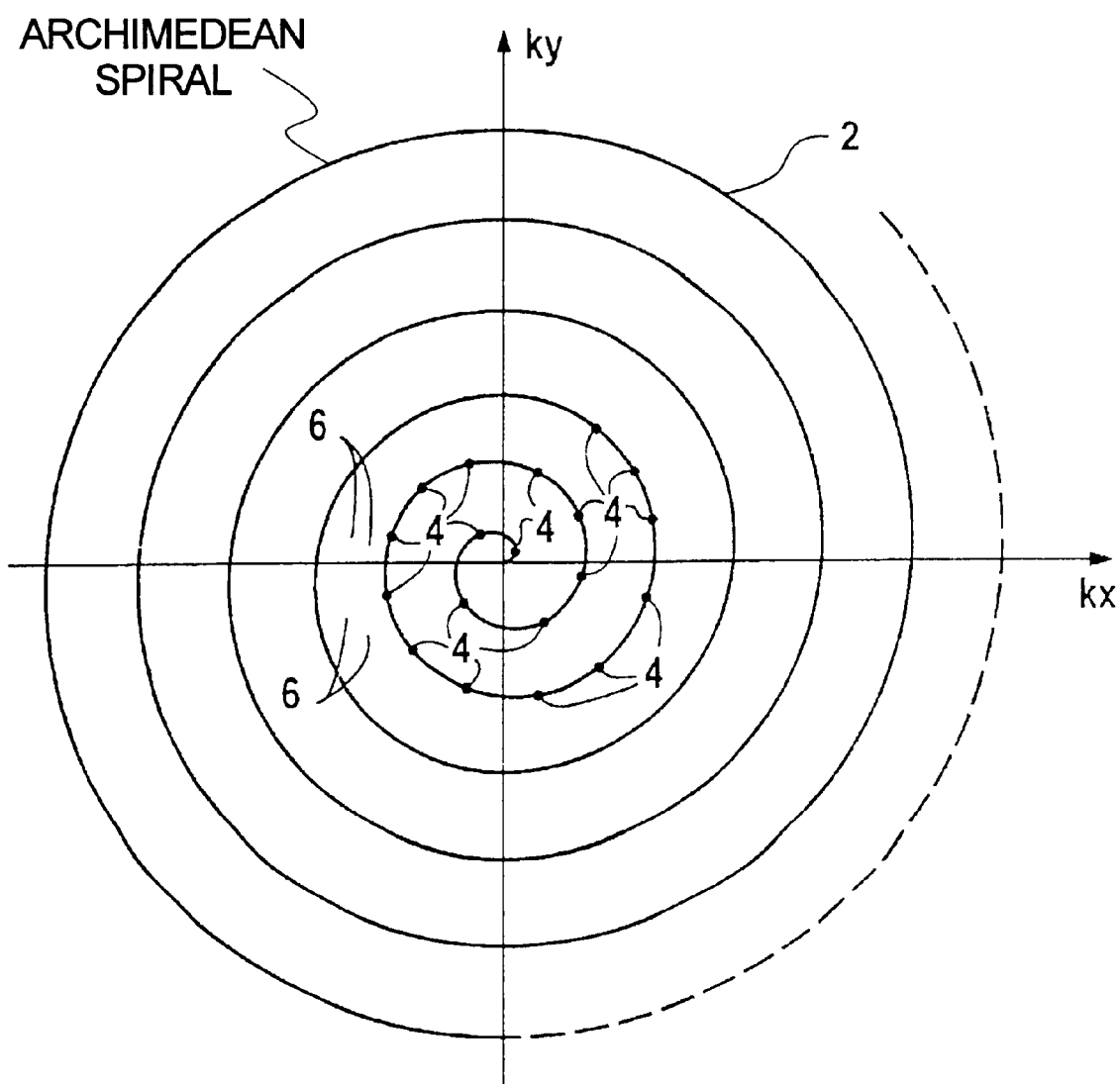
FIG. 1 is a diagram of a helical 2D k-space trajectory with uniform sampling point density in accordance with the invention.

As an example, FIG. 1 shows a k-space trajectory 2 in a kx-ky plane that exhibits a course according to an Archimedean spiral. The plane corresponds to a selected slice in the examination subject. The Archimedean spiral is characterized in that the radial spacings between the individual spiral flights are equal. This trajectory 2 is generated by two sinusoidal gradient fields whose gradients are perpendicular to one another, for example an x-gradient field and a y-gradient field. The two gradient fields are thereby phase-shifted by 90° relative to one another in terms of their time curve. The amplitudes of the gradient fields both increase linearly with the time.

Sampling points 4 are then arranged on the trajectory 2 so that, first, the sampling theorem is satisfied and, second, the number of samples obtained at these points 4 per surface element is approximately the same for each surface element 6. Only a few sample points 4 are entered as an example on the trajectory 2 in FIG. 1; in fact, the entire trajectory 2 is occupied with sample points 4. The appertaining sampling time for each sampling point 4 in k-space can be determined from the time curve of the gradient fields. The sampling points 4 lie on a curve. These sampling points 4 are stored, for example, in a memory 8 (see FIG. 2).

Figure 2:
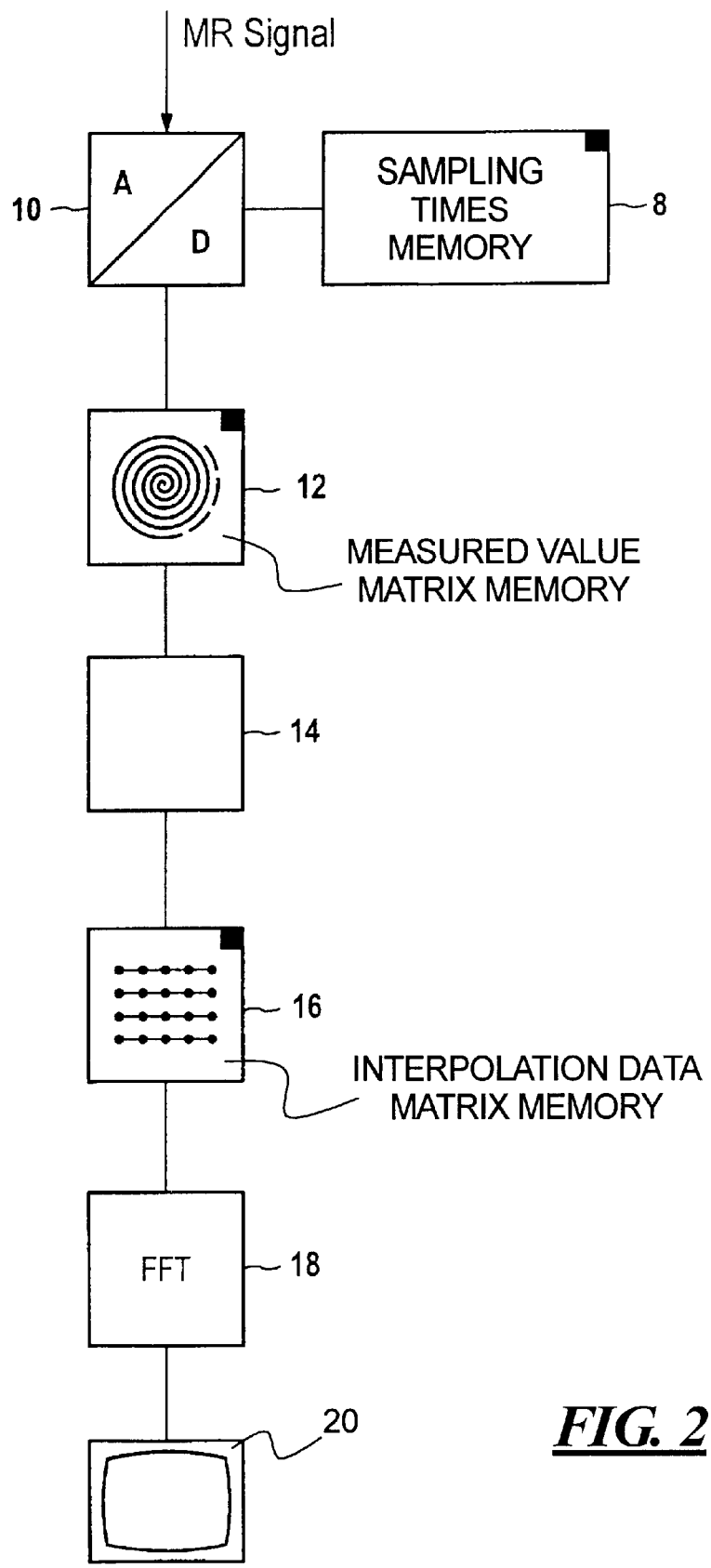
FIG. 2 is a flowchart showing the basic steps of the inventive method.

FIG. 2 shows an overview of the basic steps for imaging given a curved k-space trajectory. The execution of the measuring sequence is controlled in the reception of the magnetic resonance signals so that the received magnetic resonance signals are sampled and digitized according to the time gradient curve. The sampling times therefor are read from the memory 8 and employed for triggering an analog-to-digital converter 10 having a variable sampling rate. The samples 4 are then intermediately stored in a measured value matrix memory 12.

Although k-space is largely uniformly occupied with sample points 4, the sample points 4 themselves are not equidistantly arranged. Interpolation samples that are arranged on a rectangular grid in k-space are then generated from the samples with an interpolation 14. The interpolation values are generated with a sinc interpolation method. Each sample at each point 4 has a sinc function-like curve in k-space, so that the sinc function values of the samples that occur at the grid points merely have to be added. The interpolation can be limited to samples from sample points 4 that are arranged in the immediate environment of the interpolation sample. Due to the uniform sampling density in k-space, no additional weightings of the interpolation samples need to be carried out. The interpolation samples are stored in an interpolation data matrix memory 16.

The interpolation samples are then arranged in k-space so that image data can be reconstructed therefrom with a fast Fourier transformation 18. The image data are supplied to a display device 20 that then reproduces the structure of the examination region undistorted.

The above-described example is directed to a 2D k-space trajectory. The method for the optimum occupation of k-space with samples, and thus for low-outlay reconstruction of magnetic resonance images, however, can likewise be applied to 3D k-space trajectories. The occupation of k-space with samples must then ensue such that the number of samples per volume unit of k-space is approximately the same for each volume element. The corresponding sampling times then in turn arise from the time gradient curve that this k-space trajectory produces.

Although modifications and changes maybe suggested by those skilled in the art, it is in the intention of the inventor to embody within the patent warranted hereon all changes and modifications as reasonably and properly come within the scope of his contribution to the art.

I claim as my invention:

1. A method for producing an image with nuclear magnetic resonance comprising the steps of:

obtaining magnetic resonance signals while a magnetic gradient field is activated, said magnetic gradient field having a gradient with a direction;

modifying the direction of the gradient of the gradient field while obtaining said magnetic resonance signals, thereby producing a curved k-space trajectory;

sampling said magnetic resonance signals with a variable sampling rate to obtain samples, and digitizing said samples;

entering said samples into k-space along said curved k-space trajectory and varying said sampling rate so that an occupation density of k-space with said samples is substantially uniform;

producing samples on a rectangular grid in k-space by interpolating the samples entered into k-space along said curved k-space trajectory;

Fourier transforming said samples on said rectangular grid in k-space to generate image data; and generating a displayable image from said image data.

2. A method as claimed in claim 1, wherein the step of modifying said direction of said gradient on said gradient field comprises continuously modifying said direction of said gradient of said magnetic field.

3. A method as claimed in claim 2, comprising entering said samples into k-space along a spirally proceeding k-space trajectory as said curved k-space trajectory.

4. A method as claimed in claim 3, comprising entering said samples into k-space along a trajectory proceeding according to an Archimedean spiral as said curved k-space trajectory.

5. A method as claimed in claim 1, comprising interpolating said samples entered into k-space along said curved k-space trajectory with a sinc interpolation to produce said samples arranged on a rectangular grid.

* * * * *